United States Patent [19]
Roitman et al.

[11] Patent Number: 6,111,356
[45] Date of Patent: Aug. 29, 2000

[54] METHOD FOR FABRICATING PIXELATED POLYMER ORGANIC LIGHT EMITTING DEVICES

[75] Inventors: Daniel B. Roitman, Menlo Park; James R. Sheats, Palo Alto; Fereidoun Pourmirzaie, San Ramon, all of Calif.

[73] Assignee: Agilent Technologies, Inc., Palo Alto, Calif.

[21] Appl. No.: 09/059,608

[22] Filed: Apr. 13, 1998

[51] Int. Cl.[7] ........................................................ H01J 1/62
[52] U.S. Cl. ............................ 313/506; 313/505; 313/507
[58] Field of Search ................................... 313/505, 504, 313/506, 507, 499, 311

[56] References Cited

U.S. PATENT DOCUMENTS

| | | | |
|---|---|---|---|
| 4,814,668 | 3/1989 | Tohda et al. ............................... | 313/506 |
| 5,444,330 | 8/1995 | Leventis et al. .......................... | 313/504 |
| 5,483,120 | 1/1996 | Murakami ................................. | 313/505 |
| 5,518,824 | 5/1996 | Funhoff et al. .......................... | 313/506 |
| 5,663,573 | 9/1997 | Epstein et al. ............................ | 313/503 |
| 5,701,055 | 12/1997 | Nagayama et al. ...................... | 313/506 |
| 5,719,467 | 2/1998 | Antoniadis et al. ..................... | 313/506 |
| 5,780,174 | 7/1998 | Tokito et al. ............................. | 313/507 |
| 5,965,280 | 10/1999 | Roitman et al. ......................... | 313/506 |
| 5,965,281 | 10/1999 | Cao .......................................... | 313/506 |

*Primary Examiner*—Vip Patel
*Assistant Examiner*—Mariceli Santiago

[57] ABSTRACT

A display having a plurality of addressable pixels and a method for constructing the same. The display includes a substrate having a first conducting layer thereon. The conducting layer includes a plurality of parallel row electrodes having edges separated by insulating material. A first polymer layer constructed from one or more thin films overlies the parallel row electrodes. An insulating layer overlies the polymer layer, the insulating layer having windows therein defining pixels for the display. The insulating layer overlies the edges of the row electrodes while providing access to the first polymer layer in the area of the pixels. A second conducting layer overlies the insulating layer and includes a plurality of separated column electrodes. Each column electrode crosses a plurality of the row electrodes and is located over the windows in the insulating layer at points defining the pixels. The second conducting layer is preferably constructed by depositing a layer of photoresist over the insulating layer and patterning the layer of photoresist to provide openings extending therethrough. The openings are wider in the portion of the layer nearest to the insulating layer. This layer acts as a shadow mask for depositing a layer of conducting material. In one embodiment of the invention, a second polymer layer is located between the insulating layer and the second conducting layer. The insulating layer is preferably constructed from a layer of photoresist that is baked to cross-link the photoresist. The polymer layers include an electroluminescent material, which is preferably based on a polyfluorene.

14 Claims, 3 Drawing Sheets

METHOD FOR FABRICATING PIXELATED POLYMER ORGANIC LIGHT EMITTING DEVICES

FIELD OF THE INVENTION

The present invention relates to electroluminescent devices, and more particularly, to the fabrication of organic light emitting diodes for use in matrix-addressed displays

BACKGROUND OF THE INVENTION

Organic polymer-based electroluminescent devices (OLEDs) have the potential for providing inexpensive alternatives to alphanumeric displays and x-y addressable displays. Typically, an OLED consists of a transparent substrate coated with a transparent conducting material, such as Indium Tin oxide (ITO), one to five organic layers and a cathode made by evaporation or sputtering a metal of low work function characteristics, such as Ca or Mg. The organic layers are chosen so as to provide charge injection and transport from both electrodes to the electroluminescent organic layer (EL) where charges recombine emitting light. Usually there are one or two organic hole transport layers (HTL) between the ITO and EL, as well as one or two electron injection and transporting layers (EL) between the cathode and the EL.

OLED's are fabricated usually by either vacuum depositing the organic layers (typically dyes of low molecular weight) onto the substrate, or by spin casting from solutions in the liquid state. In the following discussion, a vacuum deposited dye device will be referred to as "D-OLED", and a polymer-based device will be referred to as a "P-OLED". In some devices, a mixture of both techniques is utilized.

To define pixels and other patterns (such as icons) on a display, the ITO, organic layers, and cathode must be patterned. The patterning of the ITO layer may be carried out by conventional photolithographic techniques.

However, the patterning of the organic layers and the cathode presents difficulties that inhibit the commercial development of OLEDs. In particular, it is difficult to obtain high-resolution patterns by vapor deposition of materials through shadow masks. In order to circumvent this problem, typical D-OLED's use a "self patterning" approach in which two layers of photoresist are patterned on ITO using microlithography to create a topology that interrupts the continuity of the dye and cathode films into discrete rows (or columns) when the cathode is deposited. While this methodology provides high-resolution patterns, the construction of multi-color displays by this technique presents problems. In particular, designs in which different color pixels are constructed by depositing different light emitting dyes are difficult to construct.

Spin cast polymers allow the generation of multi-color displays in which different pixels are constructed from different polymers. Systems for photolithographically patterning the various polymer layers have been developed for some of these polymers. For example, the patterning of organic polymers for use in generating multi-color displays is taught in PCT application PCT/GB97/00995. However, the deposition of the cathode in P-OLED's is typically carried out by depositing the cathode through a shadow mask. This shadow mask process has lower resolution than the photolithography-based methods used in D-OLEDs.

A second problem with P-OLED devices is the tendency of the anode and cathode to short through the thin polymer layers. The polymer layers are typically a 0.1 μm. The ITO layer over which the polymer is cast is also approximately this thick. A P-OLED device is typically constructed by etching column electrodes of ITO, covering the ITO columns with the relevant color polymers by one or more spin casting operations, and then depositing row electrodes for the cathode. The quality of the polymer layers at the points at which the layers step up and down from the ITO anodes to the spaces between the ITO anodes is often less than perfect. In particular, pin-holes or other breaks in the polymer layer are sometimes present at these points. When the cathode layer is deposited in rows over the polymer layer, shorts form between the cathode and underlying ITO anode. These shorts result in poor device yield.

Broadly, it is the object of the present invention to provide an improved method for constructing P-OLED displays.

It is a further object of the present invention to provide a method for constructing P-OLED displays that allows the resolution obtained in photolithography-based methods to be obtained in the cathode electrodes.

It is a still further object of the present invention to provide a method for constructing P-OLED displays which avoids the shorting problem between the anode and cathode electrode.

These and other objects of the present invention will become apparent to those skilled in the art from the following detailed description of the invention and the accompanying drawings.

SUMMARY OF THE INVENTION

The present invention is a display having a plurality of addressable pixels and a method for constructing the same. The display includes a substrate having a first conducting layer thereon. The conducting layer includes a plurality of parallel row electrodes having edges separated by insulating material. A first polymer layer overlies the parallel row electrodes. An insulating layer overlies the polymer layer, the insulating layer having windows therein defining pixels for the display. The insulating layer overlies the edge:, of the row electrodes while providing access to the first polymer layer in the area of the pixels. A second conducting layer overlies the insulating layer and includes a plurality of separated column electrodes. Each column electrode crosses a plurality of the row electrodes and is located over the windows in the insulating layer at points defining the pixels. The second conducting layer is preferably constructed by depositing a layer of photoresist over the insulating layer and patterning the layer of photoresist to provide openings extending therethrough. The openings are wider in the portion of the layer nearest to the insulating layer. This layer acts as a shadow mask for depositing a layer of conducting material. In one embodiment of the invention, a second polymer layer is located between the insulating layer and the second conducting layer. The insulating layer is preferably constructed from a layer of photoresist that is baked to cross-link the photoresist. The polymer layers include an electroluminescent material, which is preferably based on a polyfluorene and polyphenylenevinylene (PPV).

DETAILED DESCRIPTION OF THE INVENTION

The present invention gains its advantages through the use of an insulating layer having windows that define the active pixel areas. The insulating layer separates the cathode from the anode in the areas overlying the edges of the anode. Hence, this layer prevents shorting through imperfections in the polymer film in the vicinity of the edges of the anode electrodes. In addition, the insulating layer tends to planarize the active emissive regions thereby reducing step coverage problems in depositing the cathode. Finally, the insulating layer provides a base for the construction of a mask structure that defines the cathode.

Figure 1:
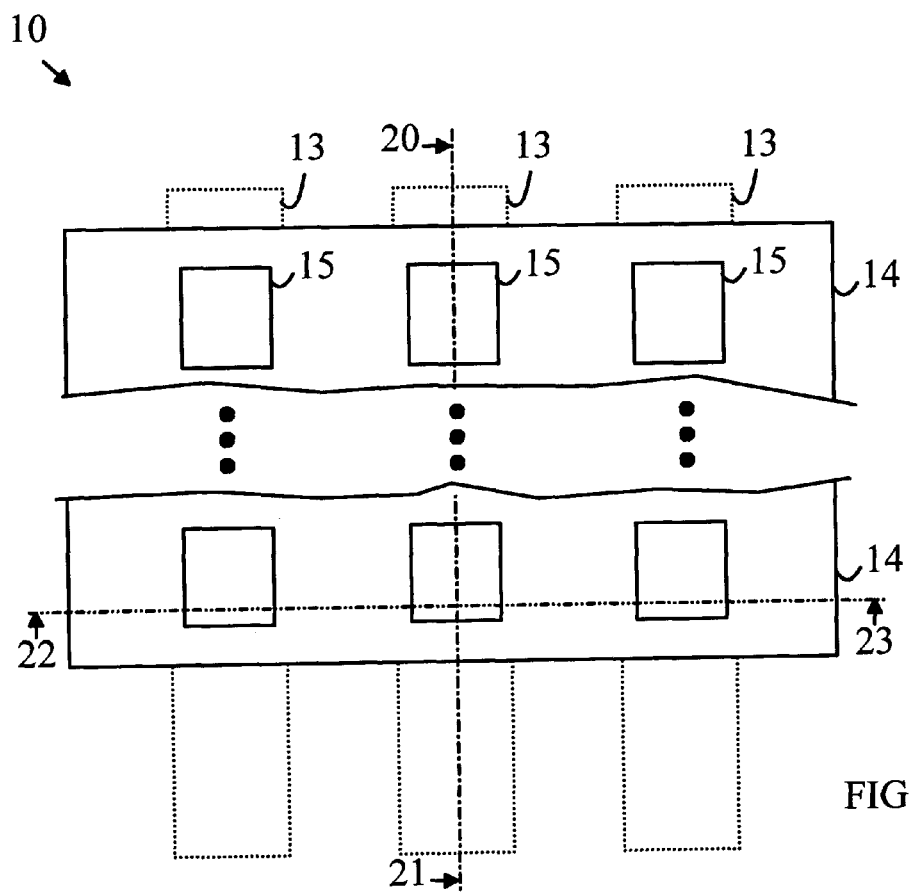
FIG. 1 is a top view of a portion of a display according to the present invention after the deposition of a windowed insulating layer.
Figure 2:
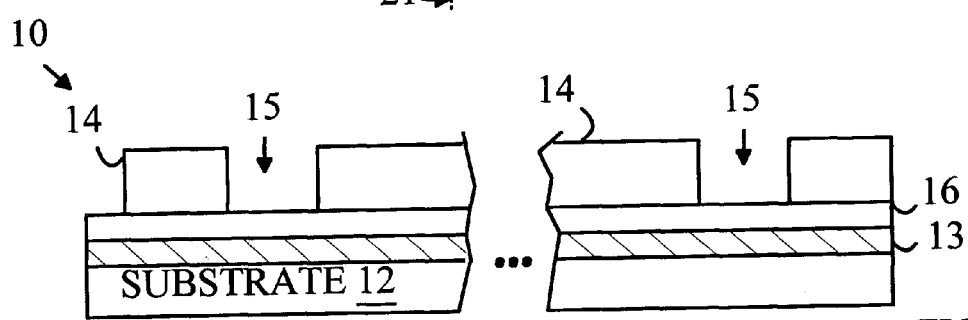
FIG. 2 is a cross-section of the display shown in FIG. 1 through line 20–21.
Figure 3:
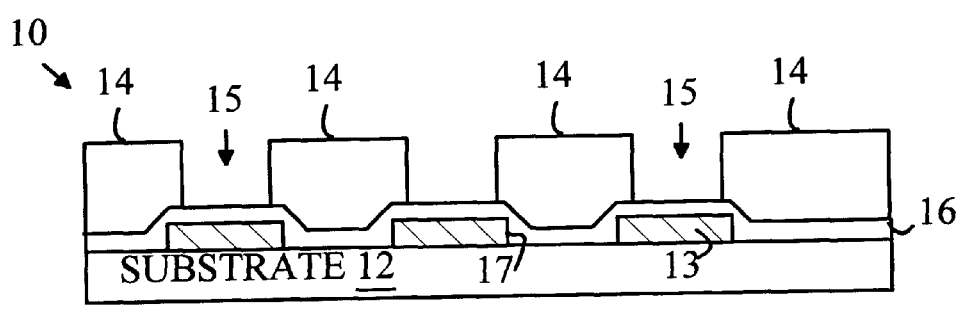
FIG. 3 is a cross-section of the display shown in FIG. 1 through line 22–23.

The manner in which a display according to the present invention is constructed can be more easily understood with reference to FIGS. 1–3. FIG. 1 is a top view of a portion of a display 10 after the insulating layer discussed above has been deposited and patterned. FIG. 2 is a cross-section of display 10 through line 20–21. FIG. 3 is a cross-section of display 10 through line 22–23. Display 10 is constructed on a transparent substrate 12. A layer of a transparent anode material such as indium tin oxide is deposited on substrate 12 and etched to form the anode electrodes 16 that connect all of the pixels in a row.

Those polymer layers that can withstand the temperatures and processing steps utilized to deposit the insulating layer 14 are deposited over the anode electrodes by one or more spin casting operations to form a layer 16. It should be noted that layer 16 may include regions having different polymers in the case of a color display. That is, the regions of polymer layer 16 that emit different colors may be patterned separately using photolithographic techniques. Typically a hole transport layer that is the same for all pixels is deposited over the anode. An EL layer is then patterned on top of the HTL. If more than one color pixel is present, the EL layer for each color is deposited separately and patterned such that the different color pixels have different EL materials. Finally, an ETL layer is deposited over the EL layer. Since the deposition and patterning of the individual polymer layers for pixelated displays is known in the art and not relevant to the present invention, a detailed discussion of these processing steps will not be given here. A number of different systems for generating polymer layers having different color emitting regions have been published. The reader is directed to PCT application PCT/GB97/00995 mentioned above and Strum and Wu, "INTEGRATED ORGANIC LIGHT EMITTING DIODE STRUCTURES USING DOPED POYMERS", Society for Information display Conference Proceedings, Sep. 15–19, 1997, Toronto, Canada for examples of such patterning systems. These publications are hereby incorporated by reference. For the purposes of the present discussion various polymer layers will be treated as a single, or double, layer having various components.

After the polymer layer has been deposited, an insulating layer 14 is deposited over the device and patterned to form windows 15 therein. The windows overlie the anode electrodes to define the light-emitting region of each pixel. It should be noted that the windows do not overlie the edges 17 of the anodes 13. Hence, any imperfections in the polymer film arising from the spin casting of the polymer layers are separated from the anode by the insulating layer.

In the preferred embodiment of the present invention, insulating layer 14 is a layer of photoresist which is cross-linked after being patterned by baking. For example, layer 14 may be constricted from conventional positive photoresists such as AZ-240 (Hoeschst Corp., AZ photoresist products, Sumerville, N.J.). The photoresist is photolithographically patterned by exposure to UV through a photomask and then developed with AZ400K. After the material in the window region has been removed, the device is baked at 140° C. for 30 minutes. It will be apparent to those skilled in the art from the preceding discussion that polymer layer 16 must be able to withstand the processing steps needed to deposit, develop and cure insulating layer 14.

If any of the component layers from which layer 16 is constructed cannot withstand these conditions, the layers are deposited over insulating layer 14 after layer 14 has been deposited and cured. In this case layer 13 is split into two layers. The first layer includes the HTL and any of the component polymer layers that can withstand the deposition of insulating layer 14 up to the first layer that cannot withstand these conditions. The remaining layers are then deposited over insulating layer 14. The order of the component layers making up layer 13 must, of course, be maintained if layer 13 is to be so divided.

The deposition of as many layers as possible under the insulating layer provides improved film quality. The thickness of the ITO layer is typically 0.15 $\mu$m or less. Hence, the steps in the anode that must be covered when the polymer layers are spun onto the anode are relatively modest compared to the step in the insulating layer which is typically 1 $\mu$m. The additional step height can result in imperfections in the polymer layers that are spun on top of the insulating layer.

In addition to withstanding the baking of insulating layer 14, the portion of layer 16 that underlies layer 14 must also be resistant to the chemical processing steps inherent in depositing layer 14. In particular, the HTL material must have good adhesion to ITO.

The sub-layers of layer 16 deposited under layer 14 must also be compatible with the photoresist deposition. In particular, these layers must be resistant to the solvents used with the photoresist and must have good adhesion to photoresist. In the preferred embodiment of the present invention, the photoresist uses water-based solutions during the development thereof. In addition, resistance to acetone, isopropyl alcohol, and saturated ammonia vapor is required. Finally, the materials of these layers must be resistant to exposure to light, both visible and UV. Here "resistant" means that the layer maintains its mechanical integrity, resistance to lifting off, and electronic characteristics (charge transport and luminance) through the process.

The HTL layer can be constructed from one or more polymer layers that are insoluble in the photoresist solvents. Polymers that are not soluble in xylenes, water, isopropyl alcohol, or acetone are preferred. For example, the HTL layer may be constructed from poly(3,4-ethylenedioxythiophene) (PEDOT). An EL layer constructed from a polymer blend based on polyfluorenes and PPV derivatives is preferred. This polymer is soluble in xylenes, and is not soluble in water, acetone, or isopropyl alcohol. The combined thickness of the two polymers is typically 150 nm.

As noted above, other layers of polymer materials may be deposited over insulating layer 14 if necessary. Insulating layer 14 is typically 1 μm. While this thickness is sufficient to partially planarize the device, it is not so thick as to substantially interfere with the spin casting of other layers of polymer. For the purposes of the present discussion, it will be assumed that no such additional layers are needed, as the polyflourene-based polymers discussed above are sufficiently resistant to the photoresist deposition process to withstand the construction of layer 14 thereon.

As noted above, one problem with prior art P-OLED displays is the shadow mask system used to deposit the cathode electrodes. The present invention avoids this problem by utilizing a tapered photoresist mask which, in effect, provides a shadow mask disposed very close to the surface of the device. The metal for the cathode electrodes is then deposited through this mask. The resolution of the resulting cathode electrodes is set by the resolution of the photolithographic process used in depositing and developing the tapered photoresist.

Figure 4:
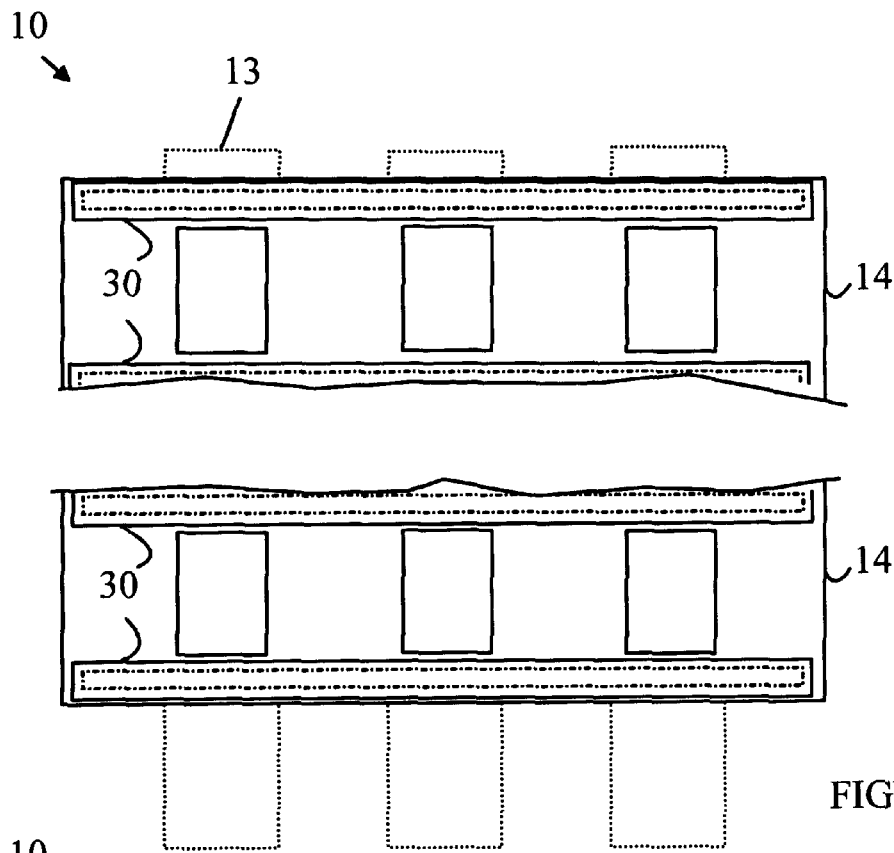
FIG. 4 is a top view of the display shown in FIG. 1 after the tapered photoresist layer has been deposited.
Figure 5:
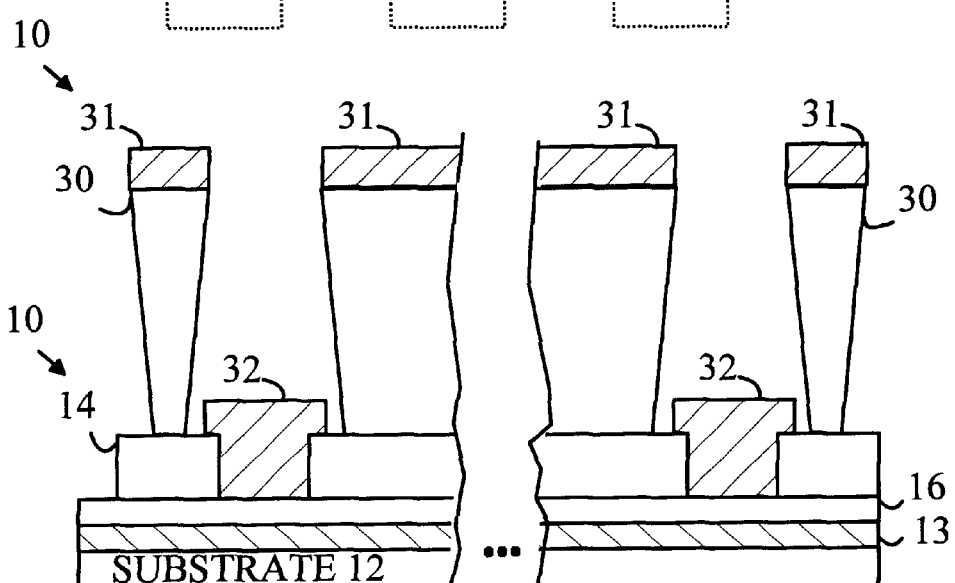
FIG. 5 is a cross-sectional view of the display shown in FIG. 4.

Refer now to FIGS. 4–5. FIG. 4 is a top view of a portion of display 10 after the tapered photoresist layer 30 has been deposited. FIG. 5 is a cross-sectional view of display 10 similar to that shown in FIG. 2 after the tapered photoresist layer and cathode material have been deposited. The cathode material 31 is deposited by evaporation over tapered photoresist layer 30. The tapered photoresist layer allows the deposition of the cathode layer 31 in a manner that provides a cathode 32 that is not in contact with the tapered photoresist. Accordingly, the photoresist can be removed without subjecting the cathode conductors to stresses that could interrupt the cathode conductors.

The construction of a tapered photoresist layer is known to the art, and hence, will not be discussed in detail here. The construction of such tapered or overhanging layers is discussed in detail in Hatzakis, et al., "Single-Step Optical Lift-Off Process", *IBM J. Res. Develop.*, 34, pp. 452–458, 1980. In the preferred embodiment of the present invention, the same photoresist material as that utilized for insulating layer 14 is utilized; however, the material is deposited to a thickness of approximately 7 μm. The layer is patterned by exposure to a broad band UV source. The exposed resist is first baked in an oven at 90° C. in vacuum and annealed in $NH_3$. The resist is then removed from the $NH_3$, exposed to UV, and then developed in an alkaline solution. The degree of taper produced is determined primarily by the initial exposure energy and the developer concentration. In the preferred embodiment of the present invention, a 75° taper is utilized.

Figure 6:
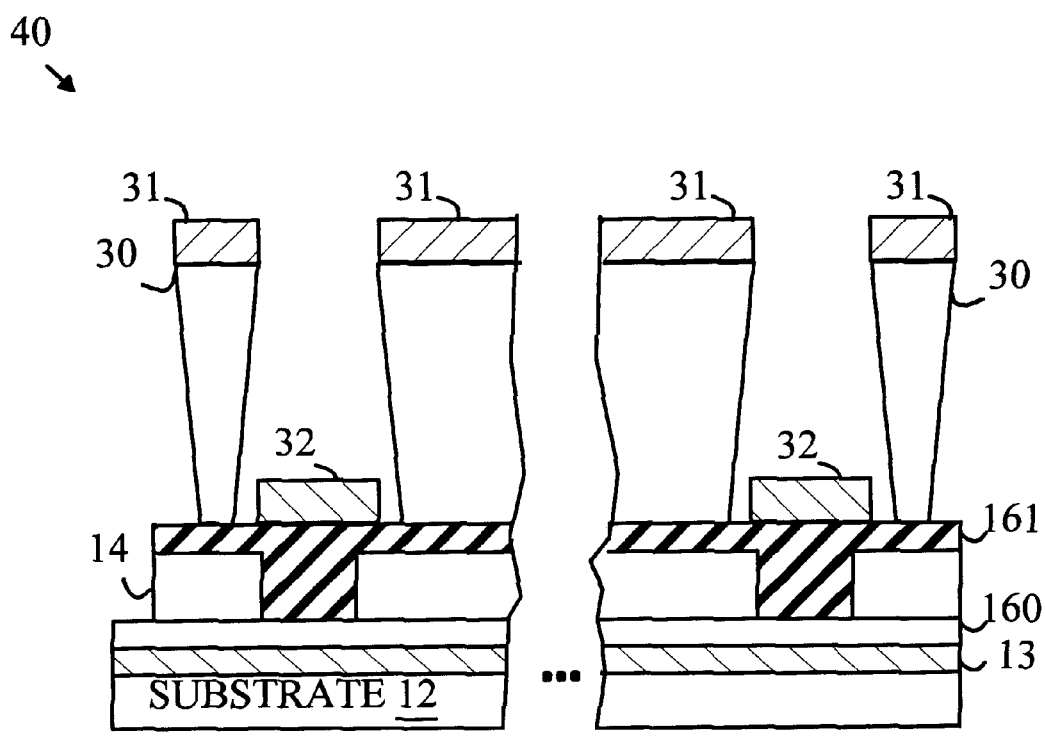
FIG. 6 is a cross-sectional view of a portion of a display according to the present invention in which the polymer layer is split into two layers.

As noted above, polymer layers that can withstand the baking of insulating layer 14 are preferably deposited prior to the deposition of insulating layer 14. However, if one or more of the polymer layers cannot withstand the high baking temperature, layer 16 can be split into two layers as shown in FIG. 6. FIG. 6 is a cross-sectional view of a portion of a display 40 in which the polymer layer is split into two layers shown at 160 and 161. To simplify the drawing, those elements that serve the same function as elements discussed above with respect to display 10 have been given the same numeric designations. Polymer layer 160 includes the portion of the polymer layer stack that can withstand the baking temperatures utilized in the deposition of insulating layer 14. After the insulating layer is completed, the remaining polymer layers are deposited as shown at 161. The tapered photoresist layer 30 is then deposited on top of polymer layer 161. The cathode material 31 is then deposited through the tapered photoresist layer to produce the cathode electrodes shown at 32.

The insulating window discussed above has additional advantages in systems in which the underlying polymer layers are deposited as thin "stripes". One method for fabricating multi-color displays is to "print" the EL polymer layers as thin stripes using a conventional printing technique. Each color corresponds to a stripe of a different EL polymer. This procedures provides a means for generating regions having different color polymers in one step, as opposed to the repeated patterning and deposition steps required to lay down the EL polymer regions by photolithographic methods. Unfortunately, the EL polymer strips obtained by printing are very thin and tend to lift off of the underlying layers. The insulating windows utilized on the present invention provide a means for preventing such lift-off, since the insulating material covers the edges, and hence, pins the edges down.

Various modifications to the present invention will become apparent to those skilled in the art from the foregoing description and accompanying drawings. Accordingly, the present invention is to be limited solely by the scope of the following claims.

What is claimed is:

1. A display having a plurality of addressable pixels, said display comprising:
   a substrate having a first conducting layer thereon, said conducting layer comprising a plurality of parallel row electrodes having edges separated by an insulating material;
   a first polymer layer overlying said parallel row electrodes;
   an insulating layer overlying said polymer layer, said insulating layer having windows therein defining pixels for said display, said insulating layer overlying said edges of said row electrodes, wherein said windows provide access to said first polymer layer; and
   a second conducting layer comprising a plurality of separated column electrodes, each column electrode crossing a plurality of said row electrodes and being located over said windows in said insulating layer at points defining said pixels.

2. The display of claim 1 further comprising a second polymer layer located between said insulating layer and said second conducting layer.

3. The display of claim 1 wherein said insulating layer comprises a layer of photoresist.

4. The display of claim 1 wherein said first polymer layer comprises a hole transport material.

5. The display of claim 1 wherein said first polymer layer comprises an electroluminescent material chosen from the group consisting of polyfluorene and PPV.

6. The display of claim 1 wherein said first polymer layer comprises an electron transport material.

7. A method for constructing a pixelated display comprising a plurality of addressable pixels, said method comprising the steps of:
   patterning a conducting layer deposited on a substrate into a plurality of parallel row electrodes having edges separated by insulating material;
   depositing a first polymer layer overlying said parallel row electrodes;
   depositing an insulating layer overlying said polymer layer, said insulating layer having windows therein defining pixels for said display, said insulating layer overlying said edges of said row electrodes, wherein said windows provide access to said first polymer layer; and depositing a second conducting layer comprising a plurality of separated column electrodes, each column electrode crossing a plurality of said row electrodes and being located over said windows in said insulating layer at points defining said pixels.

8. The method of claim 7 further comprising the step of depositing a second polymer layer located between said insulating layer and said second conducting layer after depositing said insulating layer.

9. The method of claim 7 wherein said insulating layer comprises a layer of photoresist.

10. The method of claim 9 further comprising the step of baking said layer of photoresist to a temperature sufficient to cross-link said photoresist.

11. The method of claim 7 wherein said first polymer layer comprises a hole transport material.

12. The method of claim 7 wherein said first polymer layer comprises an electroluminescent material comprising a polyfluorene.

13. A method for constructing a pixelated display comprising a plurality of addressable pixels, said method comprising the steps of:

patterning a conducting layer deposited on a substrate into a plurality of parallel row electrodes having edges separated by an insulating material;

depositing a first polymer layer overlying said parallel row electrodes;

depositing an insulating layer overlying said polymer layer, said insulating layer having windows therein defining pixels for said display, said insulating layer overlying said edges of said row electrodes, wherein said windows provide access to said first polymer layer; and depositing a second conducting layer comprising a plurality of separated column electrodes, each column electrode crossing a plurality of said row electrodes and being located over said windows in said insulating layer at points defining said pixels, wherein said step of depositing said second conducting layer comprises the steps of:

depositing a layer of photoresist over said insulating layer and patterning said layer of photoresist to provide openings extending therethrough, said openings being wider in the portion of said layer nearest to said insulating layer; and depositing a layer of conducting material through said patterned layer of photoresist.

14. The method of claim 13 wherein said layer of photoresist has a thickness greater than 7 $\mu$m.

* * * * *

UNITED STATES PATENT AND TRADEMARK OFFICE
CERTIFICATE OF CORRECTION

PATENT NO. : 6,111,356
DATED : August 29, 2000
INVENTOR(S) : Daniel B. Roitman et al.

It is certified that error appears in the above-identified patent and that said Letters Patent is hereby corrected as shown below:

The inventor information should read --

Daniel B. Roitman, Menlo Park; James R. Sheats, Palo Alto;
Fereidoun Pourmiraie, San Ramon, all of California;
Elmer B. Alinsog, Irvington, New York. --

Signed and Sealed this

Twenty-fifth Day of September, 2001

Attest:

Attesting Officer

NICHOLAS P. GODICI
*Acting Director of the United States Patent and Trademark Office*